United States Patent [19]
Lamont, Jr. et al.

[11] Patent Number: 4,756,810
[45] Date of Patent: Jul. 12, 1988

[54] DEPOSITION AND PLANARIZING METHODS AND APPARATUS

[75] Inventors: Lawrence T. Lamont, Jr., San Jose; Roderick C. Mosely, Mountain View; Timothy M. McEntee, Milpitas, all of Calif.

[73] Assignee: Machine Technology, Inc., Parisppany, N.J.

[21] Appl. No.: 938,043

[22] Filed: Dec. 4, 1986

[51] Int. Cl.$^4$ .............................................. C23C 14/34
[52] U.S. Cl. .......................... 204/192.3; 204/192.15; 204/192.32; 204/298
[58] Field of Search ...................... 204/192.12, 192.15, 204/192.17, 192.3, 192.32, 298; 156/345

[56] References Cited

U.S. PATENT DOCUMENTS

| | | | |
|---|---|---|---|
| 3,451,912 | 6/1969 | D'heurle et al. | 204/192.15 X |
| 3,528,906 | 9/1970 | Cash, Jr. et al. | 204/298 |
| 3,661,761 | 5/1972 | Koenig | 204/298 |
| 3,775,285 | 11/1973 | Lane | 204/298 |
| 3,804,738 | 4/1974 | Lechaton et al. | 204/192.22 |
| 3,868,723 | 2/1975 | Lechaton et al. | 204/192.3 |
| 3,983,022 | 9/1976 | Auyang et al. | 204/192.3 |
| 4,007,103 | 2/1977 | Baker et al. | 204/192.3 |
| 4,036,723 | 7/1977 | Schwartz et al. | 204/192.3 |
| 4,410,407 | 10/1983 | Macaulay | 204/298 X |
| 4,468,437 | 8/1984 | Patten et al. | 204/192.3 X |
| 4,664,935 | 5/1987 | Strahl | 427/38 |

OTHER PUBLICATIONS

Homma et al., "Planar Deposition of Aluminum by RF/DC Sputtering with RF Bias", Journal Electrochemical Society, vol. 132, No. 6, pp. 1466–1472 (1985).
Skelly et al., "Significant Improvements in Step Coverage Using Bias Sputtering Aluminum", Journal of Vacuum Science Technology A, vol. 4, No. 3, pp. 457–460, May/Jun., 1986.
Tsui, R. T. C., "Calculation of Ion Bombarding Energy and Its Distribution in RF Sputtering", Physical Review, vol. 168, No. 1, pp. 107–113, Apr. 5, 1968.
Bader et al., "Planarization by Radio-Frequency Bias Sputtering of Aluminum as Studied Experimentally and by Computer Simulation", J. Vac. Sci. Technol. A 3(6), Nov./Dec. 1985, pp. 2167–2171.
Bader et al. "A New Metallization Technique for Very Large Scale Integrated Structures: Experiments and Computer Simulation", J. Vac. Sci. Technol. B 4(4), Jul./Aug. 1986, pp. 833–836.
Bader et al., "Topographical Limitations to the Metallization of Very Large Scale Integrated Structures by Bias Sputtering: Experiments and Computer Simulations", J. Vac. Sci. Technol. B 4(5), Sep./Oct. 1986, pp. 1192–1194.
Machine Technology Inc. brochure, "Copper Distribution in Aluminum: Silicon: Copper Films Deposited by Various Techniques in the SypherLine TM Sputtering System," vol. 1, No. 2, Apr. 1986.
Machine Technology brochure, "Examination by Scanning Auger Microprobe of Copper Distribution in a 1 TM Planarized Film of Aluminum: Silicon: Copper Deposited by the SypherLine TM Sputtering System, vol. 1, No. 3, Apr. 1986.
Machine Technology Inc. brochure, "Planarizing Enhancement Mode 'Sputtering . . . plus' TM for Planarized Aluminum in Sypherline TM, vol. 1, No. 1, Apr. 1986.
Machine Technology, Inc. advertisement, "SypherLine TM 'Sputtering . . . plus' TM, published in Semiconductor International, Nov. 1985.

*Primary Examiner*—John F. Niebling
*Assistant Examiner*—Nam X. Nguyen
*Attorney, Agent, or Firm*—Lerner, David, Littenberg, Krumholz & Mentlik

[57] ABSTRACT

A layer of a substance such as an aluminum alloy is deposited, preferably by sputtering, onto a surface of a substrate such as a semiconductor wafer. The deposited substance is redistributed by bombarding the layer with ions. The ion bombardment may be induced by applying low frequency RF excitation at about 5 KHz $-1$ MHz to the substrate.

32 Claims, 2 Drawing Sheets

DEPOSITION AND PLANARIZING METHODS AND APPARATUS

BACKGROUND OF THE INVENTION

The present invention relates to methods and apparatus for depositing and planarizing a layer of a material on a substrate surface. Methods and apparatus according to preferred aspects of the invention are particularly useful in fabrication of microelectronic devices.

Microelectronic devices ordinarily incorporate layered structures which include microscopic electronic elements and a generally planar layer of insulating material covering these elements. In manufacture of such devices, the layer of insulating material may be formed with small holes and a layer of metal is deposited on top of the insulating layer so that metal extends into the hole to contact the electronic elements. The metal layer is then etched to form separate leads extending to the various electronic elements. Typically, the metal is deposited from the gas phase onto the insulating layer, as by evaporation, gas phase reaction processes or, most typically, by sputtering.

In sputtering, ions are impelled against the sputter source or "target" to dislodge atoms of the source, referred to as "adatoms," which then deposit on the substrate to be coated and form the layer. Ordinarily, the process is conducted under very low subatmospheric pressure by creating a plasma or mixture of gas ions and free electrons and directing the ions towards the sputter source under the influence of an electric field. The electric field typically is created either by applying a negative DC voltage or a radio frequency ("RF") excitation signal to the sputter source. Where RF excitation is applied to the sputter source, the sputter source also becomes negatively charged because the interface between the plasma and the sputter source acts as a rectifier. RF sputtering is almost universally conducted with RF excitations at 13.56 MHz, a so-called "ISM" frequency, and at other, higher, ISM frequencies. Regulations governing stray radio frequency emission from the apparatus are far less than stringent for the ISM (industrial, scientific and medical) frequencies than for other frequencies.

The metal deposited may not completely fill the holes in the insulating layer and hence may not provide reliable conductive pathways in the finished device. Because the total surface area of a hole is greater than the area of the opening of the hole in the plane of the insulating layer top surface, the average amount of material deposited in the hole per unit of surface area is less than that deposited on the planar top surface. Moreover, the material deposited adjacent the opening tends to mask the deeper portions of the hole walls, leading to particularly poor coverage of the walls and formation of voids and undercuts in the deposited material. The top surface of the metallic layer, remote from the insulating layer ordinarily has an irregularity or depression in the region overlying the original hole in the insulating layer. Such irregularities tend to create even more severe irregularities as further layers are deposited on the metallic layer during device fabrication. The voids or undercuts created by unequal deposition also cause processing problems in later fabrication steps. Problems of incomplete filling and irregular top surface configuration similar to those encountered with holes occur in the case of other non-planar features such as grooves in a layer to be covered by a gas-phase deposited layer. These problems also occur in depositing layers of materials other than metals.

These problems have become particularly acute with continued progress in other areas of microelectronic manufacture and design. All of these problems are aggravated as the size of features such as holes and grooves decreases and as the severity of the layer topography increases, i.e., as the walls of holes, grooves and the like in a substrate layer to be covered become more nearly perpendicular to the plane of the substrate layer. However, to provide further miniaturization of semiconductor devices, it is necessary to use progressively smaller holes, grooves and the like, and to employ progressively more severe layer topography. Thus, the problems noted above have posed a significant impediment to progress in microelectronics.

The art has therefore sought processes which can "planarize" a deposited layer, i.e., which can cause the layer to more completely fill holes and depressions in the underlying substrate layer and which provide a smoother top surface on the deposited layer. It has been known heretofore that planarization can be achieved by simply melting the deposited metallic or other layer. For example, in sputtering processes, considerable energy can be transferred to the metal or other sputter-deposited layer as adatoms of the sputtered material merge with the layer. The major portion of this energy typically is converted to heat. The temperature of the entire layer may rise above the solidus temperature of the sputtered material (the lowest melting temperature), so that bulk flow of the material occurs. Such bulk flow effectively fills holes and provides a flat top surface on the sputtered layer. However, unwanted effects such as segregation of elements from alloy layers, growth of metallic grains within the layer, heat damage to underlying electronic elements and the like render melting undesirable in most semiconductor application.

Other approaches which have been proposed rely upon ion bombardment and/or "resputtering" of the deposited layer in a sputtering process. Thus, as disclosed in Homma et al., *Planar Deposition of Aluminum by RF/DC Sputtering with RF Bias*, J. Electro-Chemical Soc. VOL. 132, No. 6, pp. 1466–1472 (1985), RF excitation may be applied to the substrate as well as to the target or sputter source during deposition of an aluminum layer by sputtering. Just as in conventional sputtering, RF excitation has been applied in resputtering at a frequency of about 13.56 MHz. In effect, the metallic layer deposited on the substrate surface, becomes another sputter source or target. Ions from the plasma impact upon the layer and dislodge atoms of the deposited metal from the top surface of the layer. Some of the dislodged material tends to fill the holes or other surface irregularities, and to fill in low spots on the deposited layer.

At least some of the adverse effects of the melting procedure are avoided or mitigated using the resputtering approach. However, the resputtering effect markedly slows the metal deposition process. Thus, while some metal is being deposited in the layer by the principal sputtering process, some is removed by the resputtering process. To achieve good planarization with even a moderate substrate layer topography, a resputtering rate of about 50% to about 70% is considered necessary. Stated another way, 50% of the metal deposited in a given time is lost by resputtering. Thus, the net rate of deposition is dramatically reduced, and productivity of the sputtering equipment is severely curtailed. Moreover, the ions bombarding the layer tend to heat it. To keep the total heat input to the layer within bounds and avoid melting the layer, the heat input supplied by sputtered adatoms must be reduced to compensate for this effect. Thus, the principal sputtering rate itself must be less than that used without resputtering. This factor, coupled with the losses caused by resputtering, results in a net deposition rate of about 10% or less than that achievable without resputtering. Stated another way, process time and hence process cost are increased tenfold with this RF resputtering approach.

A further approach, taught by Skelly et al., J. Vac. Sci. Technol. A, Vol. 4, No. 3, pp. 457–460 (May/June 1986), is the application of a DC bias to the substrate, also while the substrate is in proximity with a plasma in a sputtering process. The DC bias also causes bombardment of the layer by ions from the plasma. This is said to result in some degree of planarization. However, the planarizing effects occur principally after the process has operated for a considerable period of time, thereby indicating that the planarizing effects are caused at least in part by heat generated within the layer during the process. It therefore appears that the DC bias process involves bulk melting of the layer material and hence shares certain disadvantages associated with the simple melting process referred to above. The ion flux or number of bombarding ions per unit area with DC bias will necessarily be limited by the "Langmuir effect," thereby impairing the efficacy of the process. Moreover, the DC bias process typically induces some resputtering as well, typically to a resputtering rate of about 10% to about 30%. Therefore, the DC bias process considerably reduces productivity of the sputtering operation and increases its cost.

Accordingly, there has been an acute, unmet need in the art for improvements in layer depositing and planarizing processes and apparatus.

SUMMARY OF THE INVENTION

The present invention provides deposition and planarization methods and apparatus which meet these needs.

One aspect of the present invention incorporates the discovery that markedly superior results can be achieved using substrate RF excitation in a particular frequency range, between about 5 Khz and about 1 MHz, preferably between about 50 KHz and about 450 kHz and most preferably between about 100 kHz and about 250 kHz. In a process according to this aspect of the present invention, a layer forming substance, most preferably a metal, is deposited on a surface of the substrate from the gaseous phase to form the layer, the layer is exposed to a plasma and RF excitation within the aforementioned frequency range is applied to the substrate. The RF excitation applied to the substrate induces a bias on the substrate, so that ions from the plasma bombard the layer as the same is formed by deposition from the gas phase. Preferably, the amplitude of the RF excitation is selected so that the bias voltage is between about 100 and about 500 volts, and more preferably between about 100 and about 400 volts. With RF excitation of the substrate in the preferred frequency ranges according to the invention, the bombarding ions tend to mobilize the substance being deposited on the surface of the layer, rather than to dislodge such substance entirely from the surface. Thus, substantial surface mobility can be achieved with only minor amounts of resputtering. In preferred procedures according to this aspect of the present invention, the resputtering rate or rate at which the substance of the layer is dislodged by the bombarding ions is less than about ten percent of the rate at which the substance is deposited in the layer.

Moreover, this enhanced surface mobility can be achieved even while the bulk temperature of the layer being formed is maintained at a sufficiently low value, below the solidus temperature of the substance being deposited, so as to prevent undesirable melting, grain growth and segregation within the film. Stated another way, the procedures according to preferred aspects of the present invention provide surface mobility sufficient to planarize the layer without bulk melting of the layer. Most preferably, the bulk temperature of the layer is controlled during the process, as by controlling the temperature of the substrate, to keep the layer bulk temperature well below the solidus temperature of the substance being deposited in the layer. Preferably, the substance is deposited in the layer by sputtering. Thus, a sputter source is exposed to the plasma and adatoms of the layer substance are sputtered from an eroding surface of a sputter source onto the substrate surface. The sputter source may be juxtaposed with the substrate so that both are simultaneously exposed to the plasma, and sputtering from the source to the substrate surface may be induced by applying either RF excitation or a DC bias to the sputter source.

Processes according to preferred aspects of the present invention can be characterized as depositing a substance from a gas phase onto the substrate surface to form a layer while maintaining the layer at a bulk temperature below the solidus temperature of the substance and bombarding the layer with ions so as to substantially mobilize the substance on the surface of the layer and thereby promote planarization while maintaining the rate of resputtering of the layer substance caused by the ion bombardment below about ten percent of the rate of deposition. The degree of mobilization can be characterized by the "surface mobility parameter." As used in this disclosure, the term "surface mobility parameter" means the mean distance which an atom will travel along a surface. The surface mobility parameter correlates directly with the kinetic energy or temperature of the atoms at the interface between the solid and gas phase on the top surface of the layer. In the present processes this surface temperature typically is different from the bulk temperature of the layer, i.e., the temperature of the layer remote from the top surface. Preferably, processes according to the present invention provide a surface mobility parameter equal to about one micrometer or more, preferably more than about 1.5 micrometers. Such surface mobility parameters imply a surface temperature well in excess of the melting temperature range of the layer substance. Preferred processes according to the present invention provide these high surface mobility parameters even though the bulk temperature of the layer is well below the melting range, i.e., below the solidus temperature of the substance. Stated another way, preferred processes according to this aspect of the present invention provide a substantial difference between surface temperature and bulk temperature.

The surface mobility, and hence the planarization effect, can be further enhanced by maintaining the bulk temperature of the deposited layer above room temperature. For a given difference between surface temperature and bulk temperature, the surface temperature and hence the surface mobility varies directly with bulk temperature. Although the significant difference between surface temperature and bulk temperature achieved according to preferred aspects of the present invention provides a high surface mobility parameter even at relatively low bulk temperatures, it is nonetheless desirable to maintain the bulk temperature of the layer above room temperature, particularly above about 150° C. but nonetheless below the solidus temperature of the deposited material. In deposition of metals and metal alloys, and particularly aluminum or aluminum-based alloys (alloys containing more than about 50% aluminum), optimum results are achieved where the bulk temperature of the layer is between about 150° and about 525° C., and most preferably between about 475° and about 525° C. The bulk temperature of the layer and the temperature of the substrate typically are close to one another because there is good heat transfer between the layer and the substrate. The layer bulk temperature can be controlled by abstracting heat from the substrate during the process or by controlling the rate of deposition to thereby control the rate of heat addition to the layer and substrate by the deposited layer material. The layer bulk temperature can also be limited by temporarily interrupting the process, abstracting heat from the substrate during such interruption and then restarting the process. This technique is particularly valuable where the rate of heat transfer from the substrate is limited.

The planarization effects achieved by the present invention can be further enhanced by particular geometrical relationships between the sputter source and the substrate. In most typical applications, the substrate surface is generally planar, i.e., a surface having major areas or lands in a particular plane with minor areas, such as notches, grooves, holes and other depressions deviating from that plane. Planarization is enhanced by using a sputter source having a generally planar eroding surface and positioning the sputter source and substrate surface so that the plane of the eroding surface and the plane of the substrate surface define an acute angle, preferably about 10° to about 45° and most preferably about 30° between them. Thus, the adatoms sputtered from the eroding surface tend to be directed obliquely to the vector normal to the substrate surface. The adatoms thus impart some momentum along the plane of the surface, thereby further enhancing redistribution of the layer material along the surface. Planarization may be further enhanced by moving the substrate relative to the sputter source during the process, as by rotating the substrate about an axis normal to the substrate surface plane.

The present invention also provides apparatus for performing processes according to the invention. The apparatus preferably includes means for holding the substrate and means for depositing a substance on the substrate surface from a gas phase so as to form a layer of the substance. The apparatus also preferably includes means for providing plasma in proximity to the substrate surface during operation of the depositing means and RF power means for applying RF excitation to the substrate at frequencies between about 5 kHz and about 1 MHz. Typically, the depositing means includes means for retaining a sputter source having an erodable surface in proximity to the substrate so that the erodable surface faces generally towards the substrate and source power means for applying bias to the sputter source to thereby cause sputtering of the substance from the erodable surface onto the substrate surface. In this arrangement, the plasma-providing means may include the source power means. As will be appreciated from the foregoing description of the preferred processes, the substrate RF power means provide the particular excitation frequencies to the substrate which promote planarization.

These and other objects, features and advantages of the present invention will be more fully appreciated from the detailed description of the preferred embodiments set forth below, taken in conjunction with the accompanying drawings.

DETAILED DESCRIPTION OF THE PREFERRED EMBODIMENTS

Figure 1:
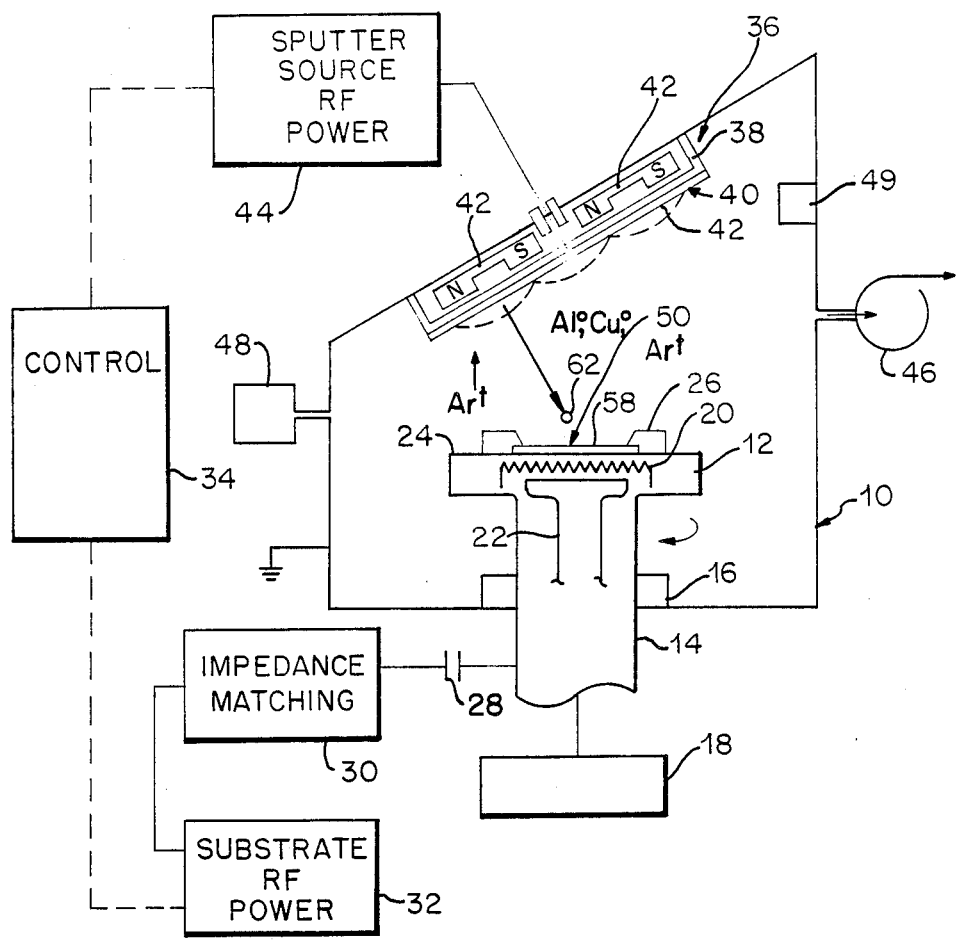
FIG. 1 is a schematic view of apparatus according to one embodiment of the present invention.

Apparatus according to one embodiment of the present invention includes a process chamber 10. A substrate holder 12 is mounted within chamber 10 on a shaft 14 extending through an insulated rotary feedthrough 16 in a side wall of the chamber. Shaft 14 and substrate holder 12 are electrically conductive metal components, as are the walls of chamber 10, but the shaft and substrate support are electrically insulated from the walls of the chamber by feedthrough 16. Shaft 14 is linked to a motor 18, so that the shaft can be rotated about its axis. Substrate holder 12 is provided with an electrical resistance heating element 20 and a cooling coil 22, which are connected to appropriate heating power sources and cooling sources (not shown). The substrate holder has a generally planar front surface 24 and clamps 26 for retaining a planar workpiece such as a semiconductor wafer on front surface 24. The axis of shaft 14 is generally horizontal, and front surface 24 lies in a substantially vertical plane.

Shaft 14 and hence substrate holder 12 are electrically connected through a DC-blocking capacitor 28 and an impedance matching network 30 to a low frequency substrate RF power source 32. The RF power source is arranged to provide RF excitation at frequencies in the range of about 5 kHz to about 1 MHz, the amplitude and frequency of these excitations being controllable by control means 34.

A planar magnetron sputter source assembly 36 is also mounted within chamber 10. Sputter source assembly 36 includes a target or source holder 38 arranged to hold a platelike sputter source 40 and magnets 42 arranged to provide generally arcuate magnetic fields in the vicinity of sputter source 40. The structure and operation of a planar magnetron are conventional and well known in the sputtering art, and accordingly need not be described further herein. However, in this apparatus the sputter source holder is arranged to maintain the sputter source 40 so that its front or eroding surface 42 extends generally vertically within chamber 10 and so that eroding surface 42 is disposed at an acute angle to the planar front surface of substrate holder 12. Sputter source assembly 36 also includes appropriate means for maintaining the sputter source or target 40 electrically insulated from the walls of chamber 10, and a lead for connecting the sputter source 40 to sputter source RF power supply 44. Supply 44 is arranged to apply RF excitations to source 40 at an excitation frequency of 13.56 MHz. The amplitude of these excitations is controllable by control means 34. A conventional vacuum pump arrangement 46 and inert gas supply 48 are also connected to the interior of the chamber 10. Conventional instruments 49 are also connected within the chamber for monitoring the pressure within the chamber and the temperature of objects within the chamber.

Figure 2:
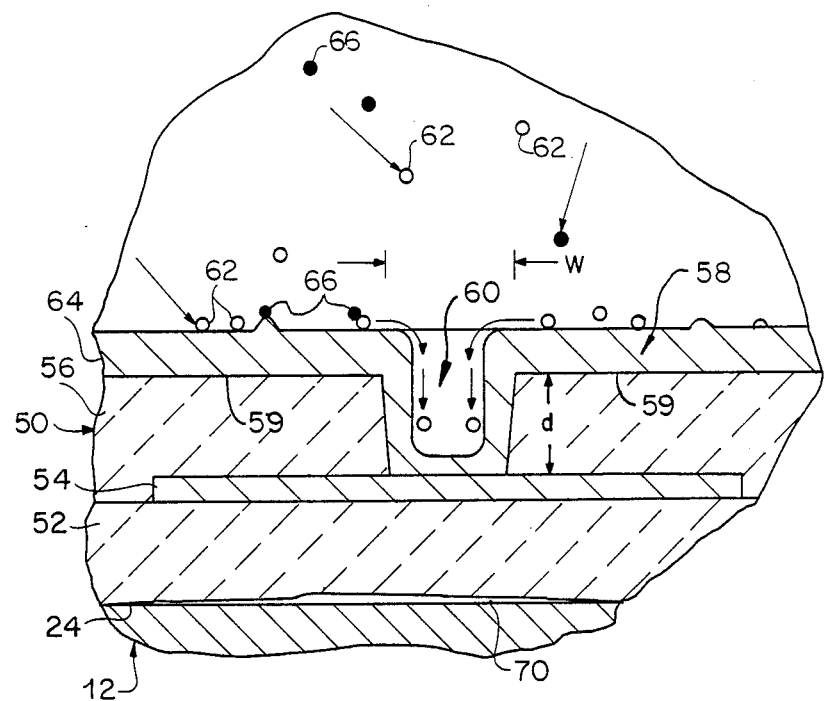
FIG. 2 is a fragmentary, idealized schematic view on a greatly enlarged scale depicting a portion of the apparatus and substrate of FIG. 1 during one process according to the present invention.

In a process according to one embodiment of the present invention, a substrate 50 is mounted on the generally planar front surface 24 of holder 12. As best seen in FIG. 2, substrate 50 is a semiconductor wafer which includes a multilayer semiconductor structure. The structure includes an electrically insulating back layer 52, an active semiconductor device region or element 54 and an electrically insulating front layer 56. Front layer 56 has a generally flat front surface 58 comprising flat, coplanar lands 59 and a via hole 60 extending into the substrate, perpendicular to the plane of lands 58, to active semiconductor device 54. As will be appreciated, the size of these features is greatly exaggerated in FIG. 2. Typically, each of the layers is on the order of two micrometers or less in thickness. The diameter w of the hole 60 may be about one to two micrometers and the depth d of the hole may be about one micron. The term "aspect ratio" as used in this disclosure with reference to a hole means the depth of the hole divided by its diameter. Hole 60 may have an aspect ratio of about 0.5 or more, and about 1.0 or more in a wafer with particularly severe topography. Also, the circumferential wall of the hole may extend substantially perpendicularly to the plane of lands 59. As will also be appreciated, the entire substrate 50 incorporates thousands of active semiconductor devices 54, and thousands of via holes 60. Also, the front surface of the substrate may include other recesses, such as grooves, notches, etc., extending into the substrate from the lands 59.

In the process, sputter source 40 is mounted to sputter source holder 38 and substrate 50 is mounted on the front surface 24 of holder 12 by retainers 26, so that the front surfaces 42 and 58 of the sputter source substrate extends vertically within chamber 10 and so that the front surface 58 of the substrate faces generally towards the front surface 42 of the sputter source. Front surfaces 42 and 58 of the sputter source and substrate define an acute angle between them. This angle preferably is between about 10° and about 45° and most preferably about 30°. Sputter source 40 is composed of the material to be deposited on the substrate. In the process illustrated, the sputter source is formed from an alloy of about 94% aluminum and 6% copper.

Vacuum pump 46 and inert gas source 48 are actuated to purge the chamber, fill the chamber with substantially pure argon and bring the chamber to an internal pressure of less than about $5 \times 10^{-7}$ Torr, and preferably even lower. Thus, the chamber contains a highly rarefied, substantially pure argon atmosphere. Heater 20 is actuated to preheat substrate holder 12 and hence substrate 50 to a preheat temperature between about 150° C. and about 450° C., most preferably between about 250° C. and about 350° C. Sputter source RF power means 44 is actuated to apply RF excitation to sputter source or target 40. The RF excitation creates a self-sustaining electrical discharge between the eroding surface 42 of sputter source 40 and the walls of chamber 10, thereby converting the rarefied argon gas within the chamber into a plasma. The magnets 42 aid in creation of a self-sustaining glow discharge at the low gas pressures employed.

The plasma created by the glow discharge comprises positively charged argon ions and free electrons. The RF excitation applied to the sputter source induces a strong negative bias, so that argon ions from the plasma impact on the eroding surface 42 of the sputter source dislodging uncharged adatoms 62 of aluminum and copper atoms. These dislodged atoms 62 are in the gas phase, and pass towards the top surface 58 of substrate 50. The free metal adatoms 62 do not generally follow straight, linear paths from surface 42 to 58. Also, the adatoms arrive at surface 58 with velocities oriented in many different directions. However, the vector sum of all these different velocities is generally along the vector normal to surface 42.

The adatoms 62 arrive on surface and accumulate in a deposited layer 64 on the front surface 58 of the substrate. As the arriving adatoms 62 have an appreciable velocity component in the direction parallel to top surface 58, the adatoms impinging on the previously deposited portion of the layer tend to mobilize the material at the interface between the layer and the vapor phase in the direction parallel to the substrate front surface. Also, during the deposition process, motor 18 is operated to rotate shaft 14 and hence rotate substrate 50 about an axis normal to the top surface 58. Preferably, the speed of rotation is selected so that less than 1% of the layer is deposited during each revolution of the substrate holder, and so that the speed of rotation is at least about 50 rpm. The momentum imparted by the adatoms will be directed in different directions parallel to the substrate front surface at different times during each revolution.

Figure 3:
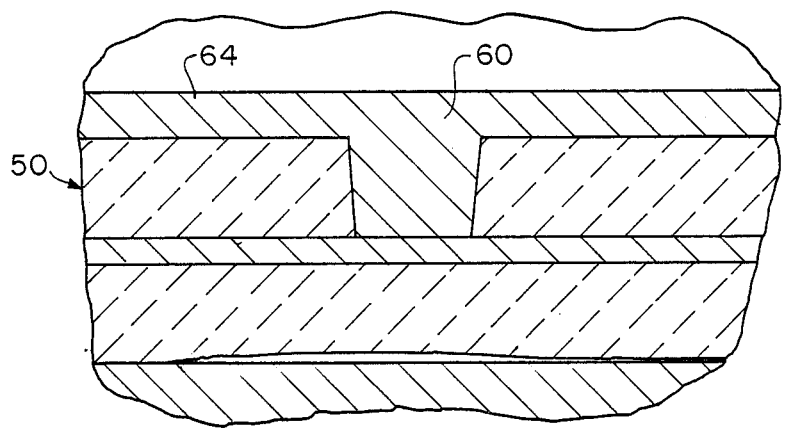
FIG. 3 is a view similar to FIG. 2 but showing the substrate after completion of the process.

Substrate RF power means 32 is actuated to supply a DC blocked RF excitation to shaft 14 and hence to substrate holder 12 and substrate 50. The RF excitation applied to the substrate induces a negative DC potential or bias on the top surface 58 of the substrate. The magnitude of this bias typically is about one-half the peak-to-peak voltage of the RF excitation. Under the influence of the oscillating RF excitation potential and the DC bias, argon ions 66 (FIG. 2) are accelerated towards the substrate and hence bombard the growing layer 64. These argon ions interact with the aluminum and copper adatoms 62 at the surface of the growing layer. As will be appreciated, FIG. 2 represents an idealized, theoretical conception of such interaction, and the present invention is not limited by any such theory of operation. Regardless of the mechanism of operation, the argon ions bombarding the growing layer mobilize the deposited layer material, and the deposited material thus spreads into any low spots in the layer, i.e., into via hole 60 and any other depressions (not shown) in substrate top surface 58. The mobilized material tends to fill in any such depressions and provide a substantially flat top surface on the deposited layer as seen in FIG. 3. Again, although the present invention is not limited by any theory of operation, it is believed that this effect results in part from shielding phenomena. Thus, the material which is disposed within a low spot or depression is to some extent shielded from the impacting argon ions. Other effects, such as interactions of the metal atoms among themselves may also play a role.

The frequency and amplitude of the RF excitations applied to substrate 50 influence on the mobilization effect achieved, and also influence other, less desired effects. As noted above, the substrate RF excitation frequency should be between about 5 kHz and about 1 MHz, preferably from about 50 kHz to about 450 kHz and most preferably from about 100 kHz to about 250 kHz. Preferably, the amplitude of the RF excitation is selected to provide a bias voltage of the substrate with respect to the plasma between about 100 and about 500 volts and more preferably about 100 to about 400 volts. Thus, the peak-to-peak amplitude of the RF excitation signal applied to the substrate should be between about 200 and 1000 volts, and preferably between about 200 and about 800 volts. The RF excitation of the substrate preferably provides a power flux through substrate 50 and deposited layer 64 to the plasma less than about 1.5 watts per square centimeter of substrate front surface area, and more preferably less than about 1.3 w/cm$^2$, most preferably between about 0.5 and about 1.3 w/cm$^2$.

At the particular frequencies mentioned, the interaction between the argon ions and the adatoms at the layer surface tends to promote mobilization rather than resputtering. Thus, full planarization can be achieved with very low resputtering rates, typically less than about 10%. That is, the bombarding ions which result from RF excitation in the preferred frequency ranges tend to have a particular energy distribution which favors conversion of the ion kinetic energy to mobilization rather than to resputtering, i.e., dislodgement of material entirely from the layer surface into the vapor phase. Equations for predicting the energy distributions of ions bombarding a surface from a plasma under the influence of RF excitation and relating the bias voltage to the excitation amplitude are well known. These equations are set forth for example, in the article Calculation of Ion Bombarding Energy and its Distribution in RF Sputtering, *Physical Review*, Volume 168, No. 1, Apr. 5, 1968, pp. 107-113, by R. T. C. Tsui. The disclosure of this article is hereby incorporated by reference herein. As set forth in greater detail in the Tsui article, the ions bombarding a surface tend to have an energy distribution centered on a predetermined central energy level $V_o$ corresponding to the bias voltage induced by the RF excitation, which voltage is approximately equal to one half the peak-to-peak amplitude of the RF excitation. With excitation frequencies of about 13.56 MHz, the energy distribution is closely clustered around $V_o$. Thus, the ion energy distribution is substantially the same as that resulting from a DC bias of the same voltage $V_o$. However, for excitation frequencies in the preferred ranges utilized in the present invention, the ion energy distribution is broader, and incorporates a very substantial portion of relatively low energy ions. Again, although the present invention is not limited by any theory of operation, it is believed that the substantial numbers of relatively low energy ions impacting on the growing layer under the influence of the RF excitation preferred according to the present invention contribute significantly to mobilization but do not cause appreciable resputtering.

Particular excitation frequencies for particular substrates can be selected by considering two significant effects. First, as explained above, lower frequencies tend to provide broader bombarding ion energy distributions, and hence greater proportions of bombarding ions which contribute to mobilization but do not contribute appreciably to resputtering. However, where the substrate is an electrically insulating body having appreciable capacitive reactance under the conditions employed, the RF excitation tends to induce alternating electrical potential differences through the substrate. Thus, at any given moment, the front surface 58 of the substrate may be at a slightly different potential than the back surface in contact with the substrate holder 12. These potential differences may produce unwanted, unpredictable electric fields at the edges of the substrate and at substrate features. These fields, in turn, may cause focusing or defocusing of the bombarding ions which can interfere with planarization.

To substantially eliminate these effects, the frequency of the RF excitation applied to the substrate preferably is high enough that the maximum voltage difference through the substrate and growing layer caused by capacitive effects is less than about 5% of the bias voltage induced by the RF excitation, preferably less than about 10 volts and most preferably less than about 5 volts. The 50 kHz–450 kHz range, and particularly the 100–250 kHz range of frequencies provides a good balance of these competing considerations for silicon and silicon dioxide-based substrates on the order of about 0.010–0.040, and particularly about 0.020 inches thick, and for other substrates having similar capacitance per unit area. For substrates having greater capacitance per unit area, the lower limit of the preferred frequency ranges shifts upwardly somewhat, whereas for substrates having lesser capacitance per unit area, the lower limit of the preferred range can be reduced somewhat. Stated mathematically, the capacitive voltage drop through the substrate is given by the formula:

$$V \simeq \sqrt{\frac{\Phi(X_c)}{A}}$$

WHERE:
V is the voltage drop through the substrate;
$\Phi$ is the power density per unit area of of substrate top surface;
$X_c$ is the capacitive reactance of the substrate; and
A is the area of the substrate top surface.
AS:

$$\frac{X_c}{A} = \frac{d}{2\pi f K \epsilon_o}$$

WHERE:
d is the mean thickness of the substrate;
f is the frequency of the RF excitation applied to the substrate;
K is the dielectric constant of the substrate material; and
$\epsilon_o$ is the permittivity of free space.
ACCORDINGLY, $$V = \sqrt{\frac{\Phi d}{2\pi f K \epsilon_o}}$$

$$f_{min} = \frac{\Phi d}{2\pi K \epsilon_o (V_{max})^2}$$

WHERE:
$f_{min}$ is the minimum RF excitation frequency; and
Vmax is the maximum desired voltage drop through the substrate.

The metal adatoms arriving at the surface of growing layer 64 and merging with the layer impart considerable energy to the layer. Typically, the adatoms have velocities and kinetic energies corresponding to the kinetic energy of aluminum vapor atoms at a temperature of about 30,000° K. This energy is converted into heat within the layer as the metal atoms merge with the layer. Also, the energy imparted to the metal atoms at the front surface of the layer by the bombarding ions is ultimately converted into heat in the layer. Accordingly, there is substantial heat input into the layer during the process. As the deposited metal layer is in intimate contact with the front surface of the substrate and as the various elements of the substrate are in intimate contact with one another, there is good heat transfer from the layer to and throughout the substrate, so that the temperature of the substrate 58 tends to track the bulk temperature of the layer 64 and the substrate acts as a "heat sink" for the growing layer. However, the thermal capacity of the substrate is limited and hence the temperature of the substrate also tends to increase in the process. To keep the layer 64 from melting and to protect the substrate from heat damage, appropriate measures are employed to control the substrate and layer bulk temperatures. Thus, appropriate measures are taken to abstract heat from the substrate and/or the growing layer during the process.

There is some heat transfer from the substrate and the layer to the walls of vessel 10, as the walls typically are cooler than the substrate. Thus, the walls serve to abstract some heat from the substrate and layer. Ordinarily, the temperature of the walls does not rise appreciably during the process, because the walls are relatively massive. If desired, however, the walls can be provided with appropriate cooling elements such as cooling coils or the like.

The substrate holder 12 also serves to abstract heat from the substrate. Preferably, substrate holder 12 is maintained at a temperature substantially less than the desired maximum temperature of the substrate and deposited layer to be attained during the process. Thus, the temperature to which substrate holder 12 is preheated should be less than the desired maximum temperature of the substrate and layer. Ordinarily, the substrate holder 12 has sufficient mass and specific heat so that the temperature of the substrate holder itself does not rise appreciably during the process. If desired, however, heat can be abstracted during the process from the substrate holder by additional cooling means such as cooling coil 22 and an external source of a cooling fluid.

Although the confronting surfaces of substrate base layer 52 and substrate holder 12 are both nominally flat, there may be minute deviations from flatness in both of these surfaces, and consequently there may be minute gaps 70 (FIG. 2) between these confronting surfaces. The pressures employed in the process are so low that gaps 70 are effectively vacuum spaces insofar as heat transfer is concerned. Thus, conduction and convection through these gaps are negligible, and the major portion of the heat transfer from the substrate to the substrate holder ordinarily proceeds by radiation from the substrate to the substrate holder. The rate of heat transfer from the substrate to the substrate holder can be increased by techniques such as sealing the substrate to the substrate holder around the periphery of the substrate and introducing a fluid such as a gas under appreciable absolute pressure between the substrate and the substrate holder. However, these techniques add considerably to the complexity of the process and apparatus, and accordingly are not preferred. Moreover, because the preferred techniques according to the present invention can achieve good planarization and relatively high rates of layer formation with only moderate energy inputs to the layer and substrate, such techniques ordinarily are unnecessary.

In particularly difficult cases, as where the topography of the substrate, prior to layer formation, is especially severe and hence there is a particularly great requirement for mobilization and mobilization energy imparted by the bombarding ions, or where the temperature of the layer and/or substrate must be limited to a particularly low value, the temperature can be controlled by abstracting heat from the substrate and/or layer as aforesaid during the sputter deposition and bombarding stages, interrupting the deposition and the ion bombardment while continuing the heat abstraction step and then resuming the ion deposition and bombardment steps. This sequence of steps can be repeated as many times as necessary. In this arrangement, heat abstraction from the layer and substrate during the interruption or interruptions supplements heat abstraction during the sputter deposition and bombardment steps. It is also possible, although markedly less preferred, to abstract heat only during interruptions.

Control of the rate of sputter deposition, as by control of sputter source RF power supply 44, also contributes to control of the substrate and layer bulk temperatures by controlling heat input to the substrate. However, the rate of deposition of the metal layer on the substrate in processes according to preferred embodiments of the present invention can be substantially the same as in non-planarizing processes. Thus, with aluminum or aluminum-based alloys, net rates of deposition onto the substrate front surface in excess of 5,000 angstroms/min, and typically about 10,000 angstroms/min can be achieved in the present processes while still maintaining the desired low bulk temperatures and also achieving substantially complete planarization. The very low resputtering rate utilized in preferred processes according to the present invention, typically less than 10% and most typically about 7% to about 9%, facilitates operation at a relatively high net deposition rate. Substantially complete planarization can be achieved even in structures having extraordinarily severe topography, such as structures including via holes with peripheral walls substantially perpendicular to the front or land surface of the substrate, having diameters of about 1.5 micrometers or less and having aspect ratios of about 0.5, 0.75 or even higher. Thus, the layer covering such a substrate can be planarized to the degree where the entire via hole 60 is completely filled with the metal, thereby providing an excellent contact with the underlying active structure 54 of the semiconductor device as illustrated in FIG. 3. Moreover, this complete planarization can be achieved with only insignificant, unobjectionable amounts of grain growth, i.e., while maintaining grain size below about 7,000 Angstroms and preferably below about 5,000 Angstroms. There is no detectable segregation of elements in the layer material. Thus, even where elements such as copper or silicon are included in addition to aluminum, these elements remain distributed uniformly throughout the layer. As will be readily appreciated by those of ordinary skill in the art, via holes as mentioned provide an extraordinarily severe test of a planarizing process. Less severe topographical features, such as tapered via holes, slots and the like can be fully covered and filled by a planarized layer using processes described.

As will further be appreciated, numerous variations and combinations of the features described above may be employed. For example, argon need not be employed to form the plasma; other inert gasses such as neon, xenon the like may be used in a sputtering process. Further, metals other than aluminum and aluminum-based alloys can be deposited and planarized according to the present invention. Typically, the bombarding ion energy required to mobilize a particular metal or metal alloy on the surface of the growing layer is directly related to the melting temperature of the material. Accordingly, the power applied to the substrate in RF excitation can be adjusted according to the melting temperature. Also, materials other than metals can be deposited and planarized according to the present invention. Notably, relatively low-melting glass compositions can be sputter deposited and can be planarized according to the present invention. Although grain growth typically is not a problem in deposition or planarization of glass layers, the relatively low layer bulk temperatures utilized in preferred processes according to the present invention tend to minimize thermal stress at the interface between the glass layer and the underlying substrate. The same relative freedom from thermal stress is also advantageous in the case of metal layers.

In the preferred processes described above, the substance deposited in the layer is injected into the vapor phase by sputtering from sputter source or target 40. Although such sputtering deposition is preferred in processes according to the present invention, other ways of depositing the layer substance can be employed. For example, metals such as aluminum and aluminum-based alloys can be evaporated from a source rather than sputtered from a source. Preferably, such an evaporation procedure will utilize a plasma in proximity to the substrate to provide the bombarding ions. The evaporated aluminum atoms will pass through the plasma and deposit on the substrate surface substantially as do the sputtered aluminum atoms in the preferred processes. Also, the substance to be deposited and planarized in the layer can be derived from the plasma itself, i.e., in a plasma-assisted chemical vapor deposition procedure. Here again, it would be preferred to employ the plasma as the source of bombarding ions, drawing these ions from the plasma by RF excitation of the substrate as described above. In its broadest compass, however, the present invention also contemplates systems in which the ions bombarding the substrate are not derived from a plasma, but instead are derived from other sources, such as an ion gun aimed towards the substrate. As will be readily appreciated, mobilization and planarization effects similar to those achieved by preferred processes according to the present invention can be attained by operating an ion gun or other ion source so that ions from the gun bombard the substrate with an energy distribution substantially similar to that of the plasma ions bombarding the substrate and growing layer in the preferred processes described above. As those of ordinary skill in the art will also appreciate, however, ion guns typically can provide only limited rates of ion bombardment and accordingly are markedly less preferred where a substantial area of an exposed substrate surface is to be treated.

As these and other variations and combinations of the features described above can be utilized without departing from the present invention as defined in the claims, the foregoing description of the preferred embodiments should be taken by way of illustration rather than by way of limitation of the present invention as described in the claims.

What is claimed is:

1. A method of depositing and planarizing a layer of a substance on a surface of a substrate comprising the steps of:
   (a) depositing said substance on said surface from a gaseous phase to thereby form said layer;
   (b) exposing said layer to a plasma during said depositing step; and
   (c) applying an RF excitation at between about 5 KHz to about 1 MHz to said substrate so that said RF excitation induces a bias voltage on said substrate with respect to said plasma whereby ions from said plasma will bombard said layer and mobilize said substance on said layer during said depositing step.

2. A method as claimed in claim 1 wherein said substance is not resputtered from said layer by said bombarding ions at a rate greater than about 10% of the rate at which said substance is deposited on said surface in said depositing step.

3. A method as claimed in claim 1 wherein said bias induced by said RF excitation is between about 100 and about 500 volts.

4. A method as claimed in claim 3 wherein the frequency of said RF excitation is selected so that the capacitive voltage drop through said substrate is less than about 10 volts.

5. A method as claimed in claim 4 wherein said frequency of said RF excitation is between about 50 kHz and about 450 kHz.

6. A method as claimed in claim 1 wherein said substance is a metal or metal alloy.

7. A method as claimed in claim 6 wherein said metal or metal alloy includes at least about 50% aluminum and said layer is maintained at a bulk temperature below about 525° C. during said depositing step.

8. A method as claimed in claim 7 wherein said bulk temperature of said layer is maintained at at least about 150° C. during said bombarding step.

9. A method as claimed in claim 8 further comprising the step of preheating said substrate to between about 150° C. and about 400° C. prior to said depositing step.

10. A method as claimed in claim 1 further comprising the step of maintaining said layer at a bulk temperature below the solidus temperature of said substance during said depositing step.

11. A method as claimed in claim 10 wherein said step of maintaining said layer at said bulk temperature includes the step of abstracting heat from said substrate during said depositing step.

12. A method as claimed in claim 1 further comprising the step of interrupting said depositing step, abstracting heat from said substrate during said interruption and resuming said depositing step after said interruption.

13. A method as claimed in claim 1 wherein said depositing step includes the step of directing adatoms of said substance towards said surface at angles oblique to the vector normal to said surface.

14. A method as claimed in claim 1 wherein said depositing step includes the step of sputtering adatoms of said substance from an eroding surface of a sputter source.

15. A method as claimed in claim 14 wherein said eroding surface and said surface of said substrate are both generally planar, said method further comprising the step of maintaining said eroding surface at an angle of between about 10° and about 45° with respect to said surface of said substrate during said depositing step.

16. A method as claimed in claim 15 further comprising the step of maintaining both said eroding surface and said surface of said substrate substantially vertical during and depositing step.

17. A method as claimed in claim 15 further comprising the step of rotating said substrate about an axis normal to said surface of said substrate.

18. A method as claimed in claim 1 wherein said depositing, exposing and applying steps are conducted so that said substance substantially fills a tubular via hole in said surface less than about two micrometers in diameter and having an aspect ratio more than about 0.5 during said depositing step.

19. A method as claimed in claim 1 wherein said depositing step includes the step of depositing said substance on a surface of a semiconductor wafer.

20. Apparatus for depositing and planarizing a layer of a substance on a surface of a substrate comprising:
(a) means for holding said substrate;
(b) means for depositing said substance on said surface from a gaseous phase to thereby form a layer of said substance;
(c) means for providing a plasma in proximity to said surface during operation of said depositing means; and
(d) substrate RF power means for applying RF excitation to said substrate at a frequency of about 5 kHz to about 1 MHz.

21. Apparatus as claimed in claim 20, further comprising temperature control means for maintaining said layer at a bulk temperature below the solidus temperature of said substance during operation of said depositing means.

22. Apparatus as claimed in claim 21 wherein said depositing means includes means for retaining a sputter source having an erodable surface in proximity to said substrate so that said erodable surface faces generally towards said substrate and said plasma, and source power means for applying a bias to said sputter source to thereby cause sputtering of said substance from said erodable surface.

23. Apparatus as claimed in claim 22 wherein said means for retaining a sputter source is operative to retain a sputter source having a generally planar erodable surface and said means for holding said substrate includes means for retaining a substrate having a generally planar front surface so that said front surface is disposed at an angle of about 10° to about 45° with respect to said erodable surface.

24. Apparatus as claimed in claim 21 wherein said temperature control means includes means for controlling the operation of said depositing means to thereby limit addition of heat to said layer by said substance as said substance is deposited in said layer.

25. Apparatus as claimed in claim 21 wherein said temperature control means includes means for abstracting heat from said substrate during operation of said depositing means.

26. Apparatus as claimed in claim 21 wherein said temperature control means is operative to maintain said bulk temperature of said layer at an elevated temperature at least about 150° C., but below said solidus temperature during operation of said depositing means.

27. A method of depositing and planarizing a layer of a substance on a surface of a substrate comprising the steps of:
(a) depositing a substance selected from the group consisting of metals and metal alloys on said surface of said substrate by sputtering to thereby form said layer;
(b) exposing said layer to a plasma during said depositing step; and
(c) applying an RF excitation at between about 50 KHz and about 450 KHz to said substrate so that said RF excitation induces a bias voltage between about 100 and about 500 volts on said substrate with respect to said plasma whereby ions from said plasma will bombard said layer and mobilize said substance on said layer during said depositing step; and
(d) maintaining said layer at a bulk temperature below the solidus temperature of said substance during said depositing step.

28. A method as claimed in claim 27 wherein said substance is not resputtered from said layer by said bombarding ions at a rate greater than about 10% of the rate at which said substance is deposited on said surface in said depositing step.

29. A method as claimed in claim 28 wherein said metal or metal alloy includes at least about 50% aluminum and said layer is maintained at a bulk temperature below about 525° C. during said depositing step.

30. A method as claimed in claim 29 wherein said bulk temperature of said layer is maintained at at least about 150° C. during said bombarding step.

31. A method as claimed in claim 30 wherein said depositing step includes the step of directing adatoms of said substance towards said surface of said substrate at angles oblique to the vector normal to said surface, the method further comprising the step of rotating said substrate about an axis normal to said surface of said substrate.

32. A method as claimed in claim 31 wherein said depositing, exposing and applying steps are conducted so that said substance substantially fills a tubular via hole in said surface less than about two micrometers in diameter and having an aspect ratio more than about 0.5 during said depositing step.

* * * * *